(12) United States Patent
Shinohara et al.

(10) Patent No.: US 9,322,844 B2
(45) Date of Patent: Apr. 26, 2016

(54) PROBE CARD FOR POWER DEVICE

(75) Inventors: Eiichi Shinohara, Nirasaki (JP); Ikuo Ogasawara, Nirasaki (JP); Ken Taoka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 75 days.

(21) Appl. No.: 14/234,679

(22) PCT Filed: Jul. 30, 2012

(86) PCT No.: PCT/JP2012/069925
§ 371 (c)(1),
(2), (4) Date: Jan. 24, 2014

(87) PCT Pub. No.: WO2013/018910
PCT Pub. Date: Feb. 7, 2013

(65) Prior Publication Data
US 2014/0176173 A1 Jun. 26, 2014

(30) Foreign Application Priority Data

Aug. 1, 2011 (JP) .................. 2011-168425

(51) Int. Cl.
*G01R 1/067* (2006.01)
*G01R 31/26* (2014.01)

(52) U.S. Cl.
CPC ........ *G01R 1/06711* (2013.01); *G01R 31/2601* (2013.01); *G01R 1/06777* (2013.01); *G01R 31/263* (2013.01); *G01R 31/2608* (2013.01);
(Continued)

(58) Field of Classification Search
CPC ........ G01R 1/067; G01R 31/02; G01R 31/12; G01R 27/00; G01R 31/20

USPC ........................................... 324/754
See application file for complete search history.

(56) References Cited

U.S. PATENT DOCUMENTS

2005/0099192 A1 5/2005 Dunklee
2008/0061803 A1* 3/2008 Lane ............................ 324/715
(Continued)

FOREIGN PATENT DOCUMENTS

DE 60 2004 010 116 T2 9/2008
EP 2 290 677 A2 3/2011
(Continued)

OTHER PUBLICATIONS

International Search Report for Application No. PCT/JP2012/069925 dated Nov. 6, 2012.

*Primary Examiner* — Tung X Nguyen
*Assistant Examiner* — Zannatul Ferdous
(74) *Attorney, Agent, or Firm* — Pearne & Gordon LLP

(57) ABSTRACT

A probe card 10 includes a first probe 11 configured to come into electric contact with an emitter electrode of a power device D; a block-shaped first connecting terminal 12 to which the first probe 11 is connected; a second probe 13 configured to come into electric contact with a gate electrode of the power device D; a block-shaped second connecting terminal 14 to which the second probe 13 is connected; a contact plate 15 configured to come into electric contact with a collector electrode of the power device D; and a block-shaped third connecting terminal 16 fixed to the contact plate 15. Further, the first connecting terminal 12, the second connecting terminal 14 and the third connecting terminal 16 electrically come into direct contact with corresponding connection terminals of a tester, respectively.

9 Claims, 8 Drawing Sheets

(52) U.S. Cl.
CPC ......... *G01R 31/2621* (2013.01); *G01R 31/2632* (2013.01)

(56) References Cited

U.S. PATENT DOCUMENTS

| | | | |
|---|---|---|---|
| 2008/0174325 A1 | 7/2008 | Komatsu | |
| 2008/0290882 A1* | 11/2008 | Rogers et al. | 324/754 |
| 2009/0219042 A1* | 9/2009 | Sasaki et al. | 324/754 |
| 2010/0033199 A1* | 2/2010 | Komatsu et al. | 324/754 |

FOREIGN PATENT DOCUMENTS

| | | |
|---|---|---|
| JP | 08-184639 A | 7/1996 |
| JP | 2006-344662 A | 12/2006 |
| JP | 2007-040926 A | 2/2007 |
| JP | 2011-138865 A | 7/2011 |
| JP | 2012-058225 A | 3/2012 |
| WO | 2007/137284 A2 | 11/2007 |

* cited by examiner

PROBE CARD FOR POWER DEVICE

CROSS-REFERENCE TO RELATED APPLICATION

This Application is a U.S. national phase application under 35 U.S.C. §371 of PCT Application No. PCT/JP2012/069925 filed on Jul. 30, 2012, which claims the benefit of Japanese Patent Application No. 2011-168425 filed on Aug. 1, 2011, the entire disclosures of which are incorporated herein by reference.

TECHNICAL FIELD

The embodiments described herein pertain generally to a probe card for a probe apparatus capable of measuring an electrical dynamic characteristic of a power device represented by, e.g., an insulated-gate bipolar transistor (IGBT) while separating the power device from a wafer.

BACKGROUND ART

A power device is widely used as a switching device for various types of power supplies or various types of electrical devices of an automobile, or used as a switching device of an electrical device of industrial machinery. As compared to a typical semiconductor device, the power device is configured to have characteristics of a high voltage, a high current, a high speed and a high frequency. Examples of such a power device may include an IGBT, a diode, a power transistor, a power MOS-FET, a thyristor, and so forth. These power devices are put on a market as electronic components for individual purposes after static characteristics or dynamic characteristics (e.g., a switching characteristic) thereof are evaluated.

A diode is used as a switching device of, e.g., a motor by being connected in parallel to a power MOS-FET, for example. As for a switching characteristic of the diode, it is desirable that a reverse recovery time of the switching device is short. If the reverse recovery time is long, the diode may be damaged depending on conditions for the usage thereof. Further, a sharp current variation (di/dt) of a reverse current may cause an increase of a current, so that the diode may be easily damaged. To measure the switching characteristic (dynamic characteristic) of the power device, every single package product of power device is measured by a dedicated measuring device, and reliability as an individual power device is evaluated.

If, however, the package product is found to be a defective product, the package product is disposed of, resulting in high cost for a qualified product. To reduce such a waste, the present applicant conducted various ways in which the power device is inspected on a wafer level by using a probe apparatus. The probe apparatus used when inspecting the power device includes a movable mounting table configured to mount thereon a semiconductor wafer; a probe card provided above the mounting table; an alignment device configured to align the semiconductor wafer with the probe card in cooperation with the mounting table; and a tester provided on and electrically connected with the probe card. The probe apparatus is configured to evaluate a dynamic characteristic such as a switching characteristic of a power device by bringing probes of the probe card into electric contact with electrodes on the semiconductor wafer after the semiconductor wafer and the probe card are aligned with each other and, then, by measuring, e.g., a current variation of the power device.

For example, a gate electrode and an emitter electrode are formed on a top surface of a semiconductor wafer on which a multiple number of power devices are formed, and a collector electrode is formed on a bottom surface of the semiconductor wafer.

In the probe apparatus configured to evaluate the dynamic characteristic of the power device, a collector electrode film made of a conductive film is formed on a top surface of the mounting table to be brought into contact with the collector electrode of the power device. Typically, the collector electrode film and the tester are connected by a cable.

In the conventional probe apparatus, however, since the cable that connects the collector electrode film of the mounting table and the tester is long, an inductance of the cable is increased. For example, an inductance of about 100 nH may increase per every 10 cm of the cable. If a current variation (di/dt) is measured on a microsecond level by using such a probe apparatus, the current variation, from which the dynamic characteristic of the power device would be evaluated, may be decreased and deviated far from an ideal value. Accordingly, it becomes difficult to measure an actual current variation (di/dt) accurately, and, occasionally, the power device may be damaged. For these reasons, the conventional probe apparatus is found not to be capable of accurately evaluating the dynamic characteristic such as the switching characteristic of the power device. Further, when turning off the power device, an abnormal surge voltage may be applied between the collector electrode and the emitter electrode, so that the power device may be damaged.

In view of the aforementioned problems, the present applicant investigated various ways to suppress an increase of the inductance in the cable. As one solution, the applicant proposed a probe apparatus shown in FIG. 7A and FIG. 7B (see Patent Document 1). In this probe apparatus, a special conducting unit is provided instead of the cable that connects the mounting table and the tester. This probe apparatus will be briefly explained with reference to FIG. 7A and FIG. 7B. As illustrated in FIG. 7A, the probe apparatus includes a mounting table 2, a probe card 3 and a conducting unit 4 in a prober chamber 1. A conductive film made of a conductive metal such as gold is formed at least on a top surface of the mounting table 2 as a collector electrode. Above the mounting table 2, the probe card 3 having a multiple number of probes 3A is fixed at a head plate (not shown) of the prober chamber 1 via a card holder 5 (see FIG. 7B). Terminal electrodes corresponding to the multiple number of probes 3A are formed on a top surface of the probe card 3 in a certain pattern, and the multiple number of probes 3A are electrically connected with a tester (not shown) via the respective terminal electrodes. For example, in FIG. 7A and FIG. 7B, a left probe 3A may come into contact with a gate electrode of a power device, and a right probe 3A may come into contact with an emitter electrode of the power device. By applying a voltage to the gate electrode, a current flows from a collector electrode to the emitter electrode of the power device, and a current variation (di/dt) at this moment is measured.

Furthermore, as depicted in FIG. 7A and FIG. 7B, the conducting unit 4 configured to electrically connect a conductive film electrode of the mounting table 2 and the tester is provided at the mounting table 2, the probe card 3 and the card holder 5. The conducting unit 4 includes, as shown in FIG. 7A and FIG. 7B, a pair of connecting terminals 4B provided at positions on a peripheral surface of the mounting table 2 such that the connecting terminals 4B face each other; and a pair of segment conductors (contact plates) 4C provided between the mounting table 2 and the probe card 3 to correspond to the pair of connecting terminals 4B. Even if the mounting table 2 is moved toward any position to measure an electrical characteristic of each power device, each of the pair of connecting terminals 4B may come into elastic contact with a corresponding one of the contact plates 4C. As a result, the collector electrode film and the tester (not shown) can be electrically connected to each other.

In the probe apparatus shown in FIG. 7A and FIG. 7B, since the conducting unit 4 is provided as stated above, a line length between the collector electrode film of the mounting table 2 and the tester is remarkably shortened, and, accordingly, an inductance is reduced. Thus, when evaluating the dynamic characteristic such as the switching characteristic of the power device, it is possible to measure a current variation in the power device accurately.

REFERENCES

Patent Document 1: Japanese Patent Laid-open Publication No. 2012-058225

DISCLOSURE OF THE INVENTION

Problems to be Solved by the Invention

However, though not mentioned in Patent Document 1, in the probe card 3, the probes 3A are connected to the tester via a measurement line including a via conductor $3B_2$ and a wiring pattern $3B_1$ of a circuit board 3B, and connecting plugs 3C such as banana terminals, as shown in FIG. 8A. As a result, a resistance on the measurement line is great and non-uniform, and a heat resistance of the measurement line is not sufficient. For the reason, when this probe card 3 is used in the probe apparatus, the probe card 3 may not exhibit sufficient performance. Furthermore, as shown in FIG. 8B, for example, since a measurement line of the conducting unit 4 includes the connecting plugs 3C, the via conductor $3B_2$ and the wiring pattern $3B_1$ of the circuit board 3B, and a pogo pin 3D, this measurement line also has the same problems as those of the measurement line between the probes 3A and the tester. Moreover, since the probe card 3 is connected to the tester via a multiple number of connecting plugs 3C, a great force is required to attach or detach the probe card 3. Thus, it may be difficult to replace the probe card 3 automatically, for example.

In view of the foregoing problems, example embodiments provide a probe card for a power device, which can obtain sufficient reliability when used in a probe apparatus by remarkably reducing a resistance of a measurement line between a probe and a tester and a resistance of a measurement line between a mounting table and the tester, and also can be easily replaced automatically.

Means for Solving the Problems

In order to solve the problem as described, in one example embodiment, a probe card that inspects a dynamic characteristic of a multiple number of power devices formed on a semiconductor wafer includes a first probe configured to come into electric contact with an emitter electrode of the power device; a block-shaped first connecting terminal to which the first probe is connected; a second probe configured to come into electric contact with a gate electrode of the power device; a block-shaped second connecting terminal to which the second probe is connected; a contact plate configured to come into electric contact with a collector electrode of the power device; and a block-shaped third connecting terminal fixed to the contact plate. Further, the first connecting terminal, the second connecting terminal and the third connecting terminal electrically come into direct contact with corresponding connection terminals of a tester, respectively.

In one example embodiment, the first connecting terminal and the second connecting terminal may be fixed to a supporting board such that the first connecting terminal and the second connecting terminal are inserted through the supporting board and exposed from two opposite surfaces of the supporting board. Further, the contact plate may be fixed to a surface of the supporting board at a side of the first and second probes, and the third connecting terminal may be inserted through a hole formed in the supporting board.

In one example embodiment, a plate spring member whose central portion is protruded may be provided on a surface of each of the first connecting terminal, the second connecting terminal and third connecting terminal at a side of the tester.

In one example embodiment, the plate spring member may include a multiple number of stripe-shaped portions.

In one example embodiment, each of the first connecting terminal, the second connecting terminal and the third connecting terminal may have a connector.

In order to solve the problem as described, in another example embodiment, a probe card that inspects a dynamic characteristic of a multiple number of power devices formed on a semiconductor wafer includes a first probe configured to come into electric contact with an emitter electrode of the power device; a second probe configured to come into electric contact with a gate electrode of the power device; a circuit board having a wiring pattern to which each of the first probe and the second probe is connected; a contact plate fixed to a surface of the circuit board at a side of the first and second probes and configured to come into electric contact with a collector electrode of the power device; a block-shaped first connecting terminal and a block-shaped second connecting terminal provided at a tester and configured to come into electric contact with the wiring pattern to which each of the first probe and the second probe is connected; and a block-shaped third connecting terminal provided at the tester and configured to come into electric contact with the contact plate by being inserted through a hole formed in the circuit board.

In another example embodiment, a plate spring member whose central portion is protruded may be provided on a surface of each of the first connecting terminal and the second connecting terminal that is in contact with the wiring pattern.

In another example embodiment, the plate spring member may include a multiple number of stripe-shaped portions.

In another example embodiment, each of the first connecting terminal, the second connecting terminal and the third connecting terminal may have a connector.

Effect of the Invention

In accordance with the example embodiments, it is possible to provide a probe card for a power device, which can obtain sufficient reliability when used in a probe apparatus by remarkably reducing a resistance of a measurement line between a probe and a tester and a resistance of a measurement line between a mounting table and the tester, and also can be easily replaced automatically.

MODE FOR CARRYING OUT THE INVENTION

In the following, example embodiments will be described, and reference is made to the accompanying drawings, FIG. 1 to FIG. 6B, which form a part of the description.

Figure 1:
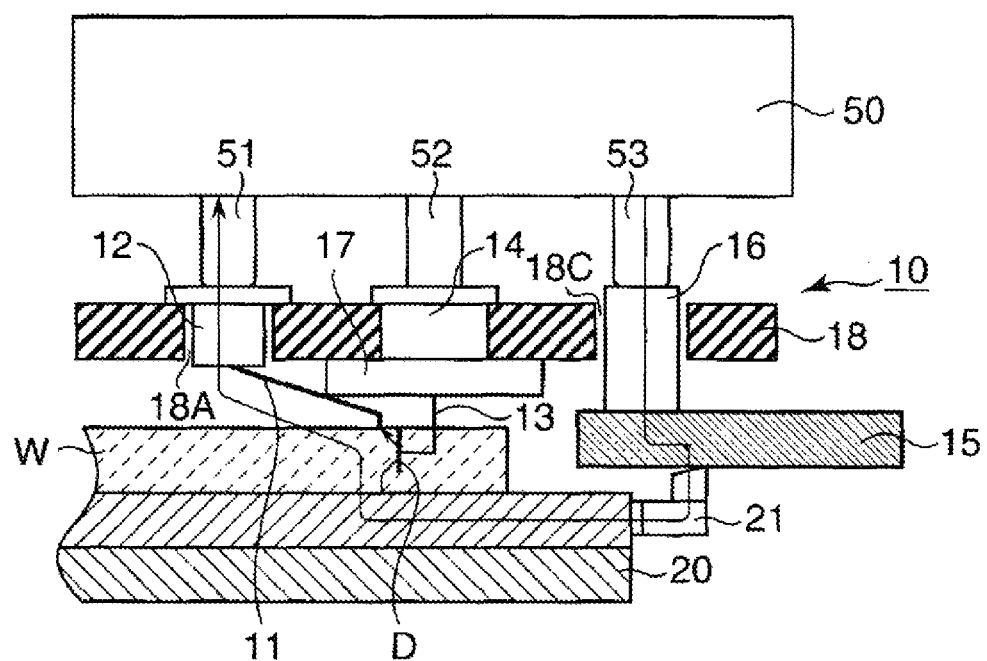
FIG. 1 is a conceptual diagram illustrating an example probe apparatus to which a probe card in accordance with a first example embodiment is applied.

FIG. 1 is a conceptual diagram illustrating an example probe apparatus to which a probe card in accordance with a first example embodiment is applied.

As illustrated in FIG. 1, for example, a probe card 10 in accordance with the first example embodiment is provided above a movable mounting table 20 and is configured to evaluate a switching characteristic (dynamic characteristic) of a power device D by being brought into electric contact with a semiconductor wafer W mounted on the mounting table 20.

The probe card 10 in accordance with the first example embodiment includes, as shown in FIG. 1, a first probe 11 configured to come into contact with an emitter electrode of the power device D; a block-shaped first connecting terminal 12 to which the first probe 11 is connected; a second probe 13 configured to come into contact with a gate electrode of the power device D; a block-shaped second connecting terminal 14 to which the second probe 13 is connected; contact plates 15 connected to a collector electrode of the power device D; a block-shaped third connecting terminal 16 fixed on a top surface of each contact plate 15; and a probe supporting body 17 configured to support the first and second probes 11 and 13. The probe card 10 is fastened to a probe apparatus via a card holder 30 (see FIG. 2A and FIG. 3A) and connected to a tester 50 via the first, second and third connecting terminals 12, 14 and 16.

Figure 2A:
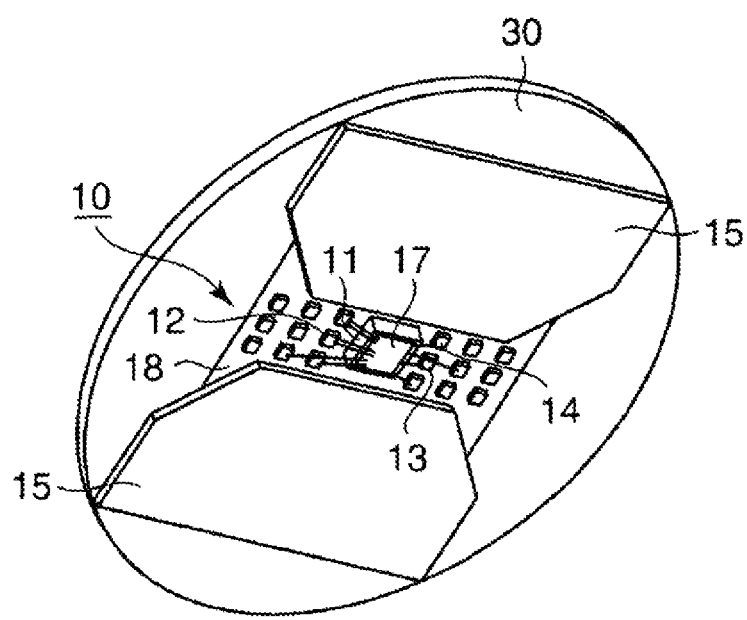
FIG. 2A is a perspective view of the probe card shown in FIG. 1 when seen from a bottom side thereof.
Figure 2B:
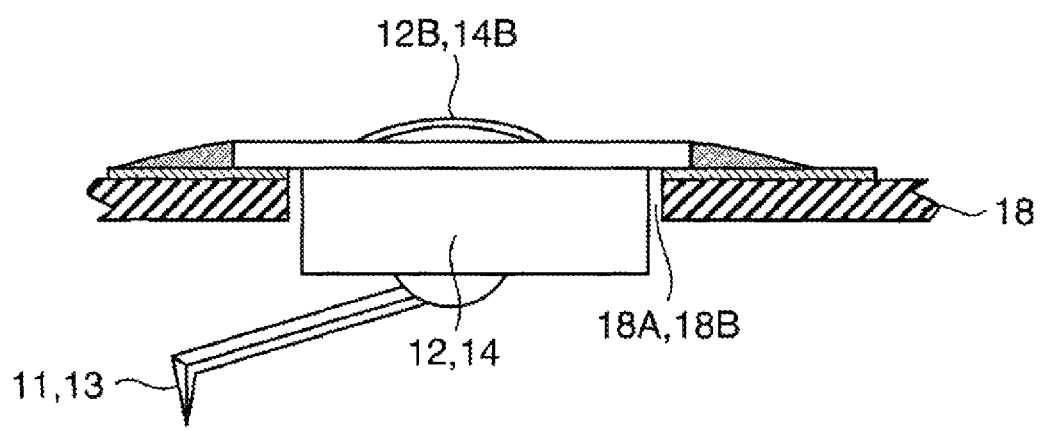
FIG. 2B is a side view illustrating a first connecting terminal and a second connecting terminal of the probe card shown in FIG. 1.

As illustrated in FIG. 1 and FIG. 2B, a base end of the first probe 11 is connected to a bottom surface of the first connecting terminal 12. A leading end of the first probe 11 is extended to be inclined downward and is supported by the probe supporting body 17 in a cantilever manner. The leading end of the first probe 11 is configured to come into contact with the emitter electrode of the power device D. The first connecting terminal 12 is fastened to a supporting board 18 by being inserted through a first hole 18A formed in the supporting board 18, as illustrated in FIG. 1. An upper end surface of the first connecting terminal 12 comes into direct contact with an emitter terminal 51 of the tester 50.

The second probe 13 and the second connecting terminal 14 have the same configurations as those of the first probe 11 and the first connecting terminal 12, as shown in FIG. 2B. That is, as depicted in FIG. 1 and FIG. 2B, a base end of the second probe 13 is connected to a bottom surface of the second connecting terminal 14. A leading end of the second probe 13 is extended to be inclined downward and is supported by the probe supporting body 17 in a cantilever manner. The leading end of the second probe 13 is configured to come into contact with the gate electrode of the power device D. Like the first connecting terminal 12, the second connecting terminal 14 is fastened to the supporting board 18 by being inserted through a second hole 18B formed in the supporting board 18. An upper end surface of the second connecting terminal 14 comes into direct contact with a gate electrode 52 of the tester 50.

Figure 3A:
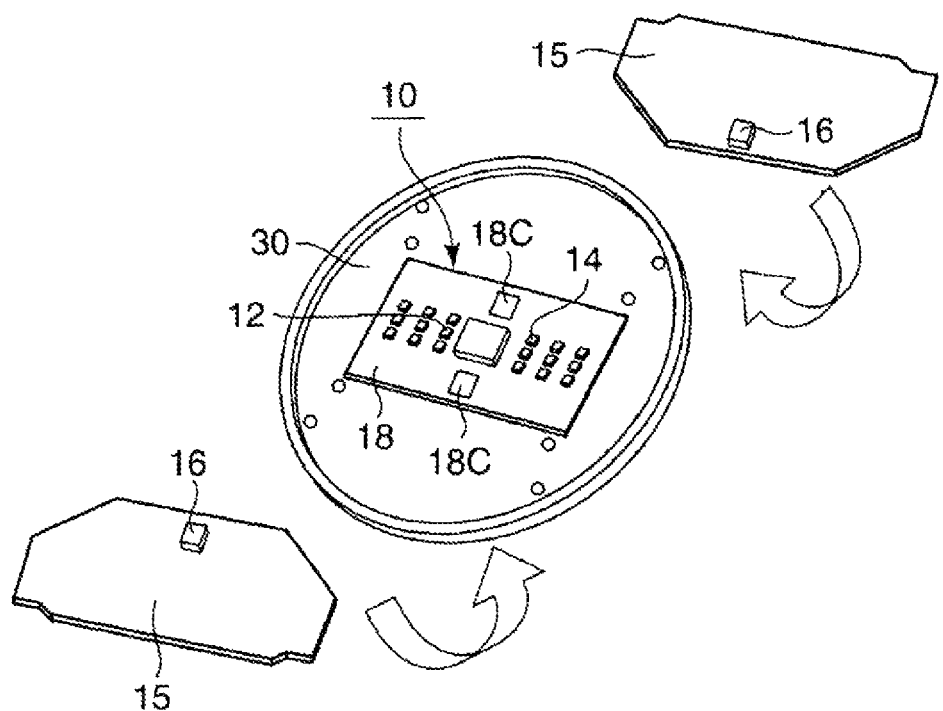
FIG. 3A is an exploded perspective view of the probe card shown in FIG. 1.
Figure 3B:
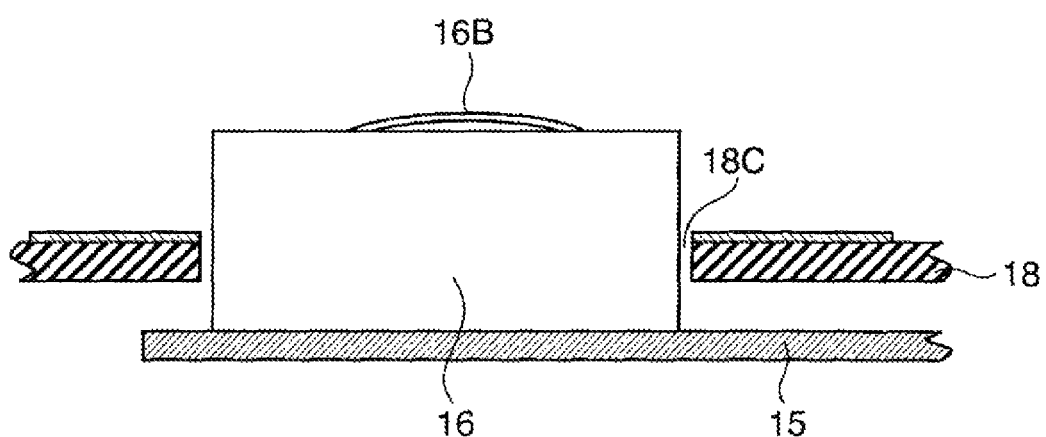
FIG. 3B is a side view illustrating a third connecting terminal of the probe card shown in FIG. 1.

Each contact plate 15 is connected to a conductive film electrode (collector electrode) (not shown) formed on a surface of the mounting table 20 via a contact block 21 provided at a side surface of the mounting table 20, as illustrated in FIG. 1. A leading end portion of the contact block 21 is elastically moved in a vertical direction. With this configuration, the contact block 21 comes into elastic contact with the contact plate 15 when the mounting table 20 is moved at the time of inspecting the power device D. As a result, a large current can flow between the contact plate 15 and the contact block 21 and, besides, between the collector electrode of the power device D and a collector terminal 53 of the tester 50. Each of the contact plates 15 has a hexagonal shape, as illustrated in FIG. 2A. The contact plates 15 are fixed to the card holder 30 at multiple positions thereof to cover two facing periphery portions of the supporting board 18. Each contact plate 15 is fixed to the card holder 30 by screw members at the multiple positions. Further, a spacer (not shown) is provided at a fixed position between the contact plate 15 and the card holder 30, and, accordingly, a gap is formed between the contact plate 15 and the card holder 30. As illustrated in FIG. 3A, the third connecting terminal 16 is fixed at a portion of the contact plate 15 that covers the periphery portion of the supporting board 18. As shown in FIG. 1 and FIG. 3B, the third connecting terminal 16 is inserted through a third hole 18C formed in the supporting board 18 and is configured to come into direct contact with the collector terminal 53 of the tester 50.

Figure 8A:
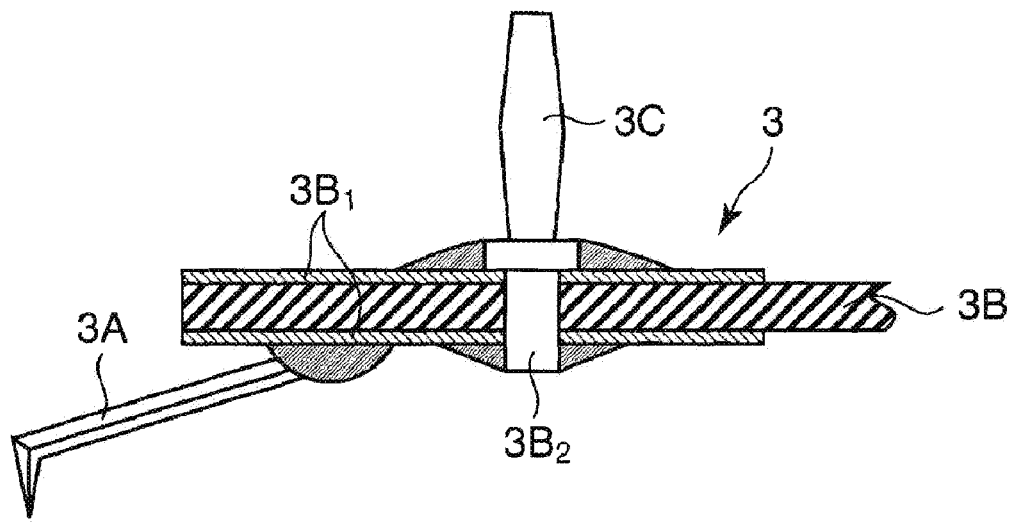
FIG. 8A is a cross sectional view illustrating major parts of the probe card shown in FIG. 7A and FIG. 7B.
Figure 8B:
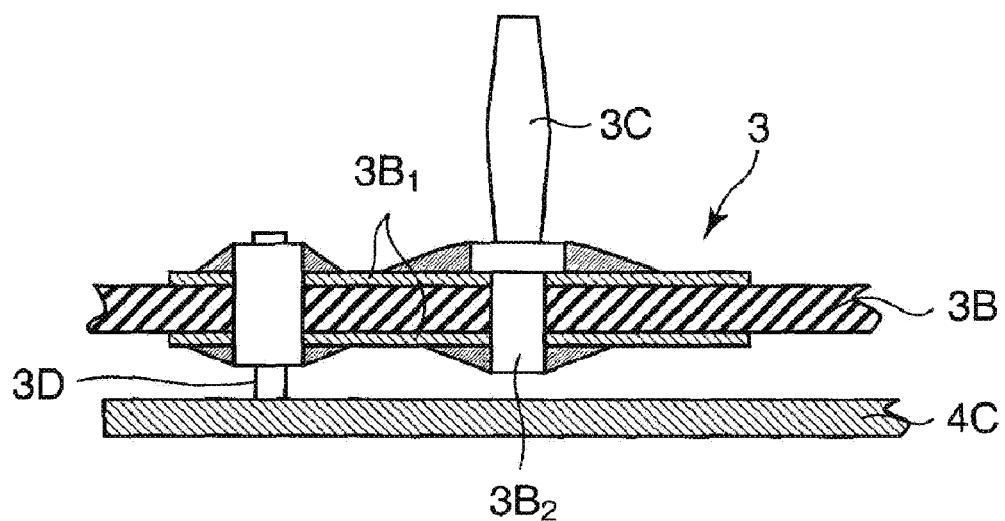
FIG. 8B is a cross sectional view illustrating major parts of the probe card shown in FIG. 7A and FIG. 7B.

As stated above, the first, second and third connecting terminals 12, 14 and 16 are block-shaped and come into direct contact with the emitter terminal 51, the gate terminal 52 and the collector terminal 53 of the tester 50, respectively. Thus, as compared to the probe card shown in FIG. 8A and FIG. 8B in which probes are connected to respective terminals of a tester via a multiple number of conductors, a resistance in a measurement line is remarkably reduced. Accordingly, even when a large current flows, an amount of heat generation may be small, and, thus, a lack of a heat resistance may not occur. Thus, the reliability of the evaluation of the power device D can be greatly improved.

Further, the first, second and third connecting terminals 12, 14 and 16 have connectors (terminal blocks) 12A, 14A and 16A, respectively, as shown in FIG. 4A, FIG. 4B, FIG. 5A and FIG. 5B, and are configured to securely flow a large electric current via the connectors 12A, 14A and 16A, respectively. The first, second and third connecting terminals 12, 14 and 16 are made of a good conductor such as copper, and the connectors 12A, 14A and 16A are also made of a good conductor such as copper, like the first, second and third connecting terminals 12, 14 and 16.

Moreover, plate spring members 12B, 14B and 16B are formed on top surfaces of the first, second and third connecting terminals 12, 14 and 16, respectively, as illustrated in FIG. 2B and FIG. 3B. These connecting terminals 12, 14 and 16 are allowed to come into elastic contact with the emitter terminal 51, the gate terminal 52 and the collector terminal 53 of the tester 50 through the plate spring members 12B, 14B and 16B, respectively. With this configuration, the first, second and third connecting terminals 12, 14 and 16 are securely and electrically connected to the emitter terminal 51, the gate terminal 52 and the collector terminal 53 of the tester 50. Thus, it is possible to flow a large current stably, and reliability of the evaluation of the power device can be increased.

Figure 4A:
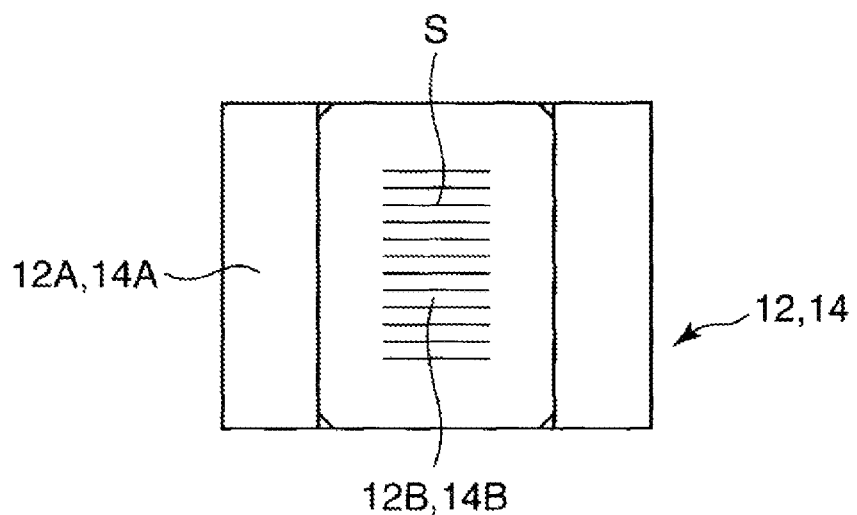
FIG. 4A is a plane view of the first connecting terminal and the second connecting terminal of the probe card shown in FIG. 2A and FIG. 2B.
Figure 4B:
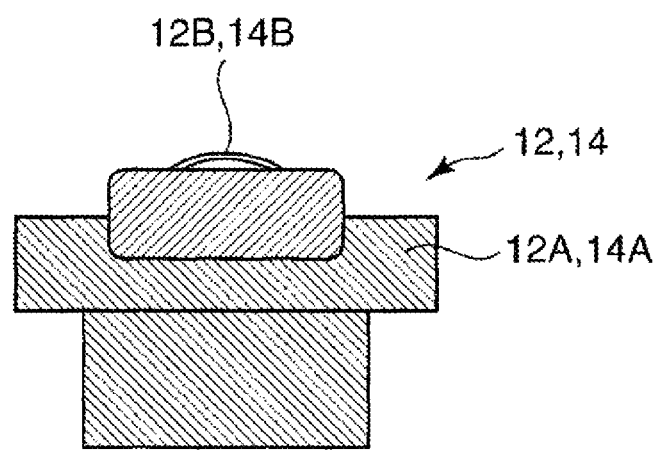
FIG. 4B is a transversal cross sectional view of the first connecting terminal and the second connecting terminal of the probe card shown in FIG. 2A and FIG. 2B.
Figure 5A:
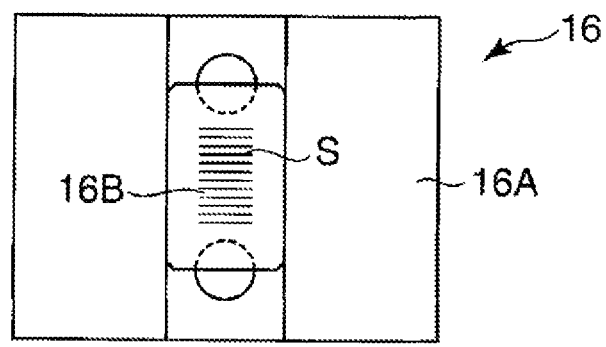
FIG. 5A is a plane view of the third connecting terminal of the probe card shown in FIG. 3A and FIG. 3B.
Figure 5B:
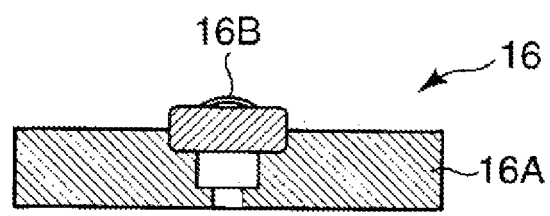
FIG. 5B is a transversal cross sectional view of the third connecting terminal of the probe card shown in FIG. 3A and FIG. 3B.

A multiple number of slits S is formed on each of the plate spring members 12B, 14B and 16B at a regular interval, as illustrated in FIG. 4A and FIG. 5A. These slits S divide each of the plate spring members 12B, 14B and 16B into multiple stripe-shaped portions. A tolerance current of a preset value is flown to each of the stripe-shaped portions. Accordingly, it is possible to set the current flowing in each of the first, second and third connecting terminals 12, 14 and 16 to be a required tolerance current value by adjusting the number of the stripe-shaped portions.

Now, an operation of the probe card 10 will be elaborated. When fastening the probe card 10 in accordance with the first example embodiment to the probe apparatus via the card holder 30, as illustrated in FIG. 1 and FIG. 2A, the block-shaped first, second and third connecting terminals 12, 14 and 16 is elastically and conductively come into contact with the emitter terminal 51, the gate terminal 52 and the collector terminal 53 of the tester 50 via the plate spring members 12B, 14B and 16B, respectively.

Then, the mounting table 20, which mounts thereon the semiconductor wafer W on which a multiple number of power devices D is formed, as shown in FIG. 1, is moved, and alignment between the emitter electrode and the gate electrode of the power device D and the first probe 11 and the second probe 13 of the probe card 10 is performed by the alignment device. Thereafter, the mounting table 20 is moved, and the emitter electrode and the gate electrode of the power device D to be firstly inspected come into contact with the first probe 11 and the second probe 13, respectively. At this time, the contact block 21 and the contact plates 15 also come into contact with each other elastically. Further, by overdriving the mounting table 20, the power device D and the tester 50 are electrically connected to each other. Accordingly, the emitter electrode, the gate electrode and the collector electrode of the power device D are electrically connected to the emitter terminal 51, the gate terminal 52 and the collector terminal 53 of the tester 50, respectively.

Afterward, if the power device D is turned on by applying a gate current from the gate terminal 52 of the tester 50 to the gate electrode of the power device D via the block-shaped second connecting terminal 14 and the second probe 13 of the probe card 10, a large current (e.g., about 600 A) flows from the collector terminal 53 of the tester 50 to the collector electrode of the power device D via the block-shaped third connecting terminal 16, the contact plate 15, the contact block 21 and the conductive film electrode (collector electrode) of the mounting table 20. This large current flows from the emitter electrode of the power device D to the tester 50 via the first probe 11, the block-shaped first connecting terminal 12 and the emitter terminal 51, and then, is measured at the tester 50. In this way, by applying a gate voltage to the gate electrode of the power device D from the tester 50, a large current is flown from the collector electrode to the emitter electrode. After measuring a current variation, the power device is turned off. Based on the measurement of the current variation, it is possible to evaluate a dynamic characteristic of the power device D accurately.

As discussed above, in accordance with the first example embodiment, the block-shaped first connecting terminal 12 to which the first probe 11 is connected, the block-shaped second connecting terminal 14 to which the second probe 13 is connected, and the block-shaped third connecting terminal 16 is directly contacted with the emitter terminal 51, the gate terminal 52 and the collector terminal 53 of the tester 50, respectively. Thus, a resistance in the measurement line is remarkably reduced and a heat resistance is high. With these advantages, as the probe card 10 of the probe apparatus, it is possible to perform highly reliable device evaluation. Furthermore, in the typical probe card, each probe is connected to a tester via a pogo pin. Thus, when replacing the probe card, contact states between respective parts need to be precisely adjusted not to cause a pressure error of the pogo pin or a contact failure between the pogo pin, the probe and each terminal of the tester. In the probe card in accordance with the present example embodiment, however, the first, second and third connecting terminals 12, 14 and 16 come into direct contact with the emitter terminal 51, the gate terminal 52 and the collector terminal 53 of the tester 50, respectively, and no pogo pin is provided. Thus, the precise adjustment of the contact states may not be necessary, and the probe card 10 can be automatically replaced easily. Hence, it is possible to obtain the probe card 10 having high practicality.

Moreover, in accordance with the first example embodiment, the first, second and third connecting terminals 12, 14 and 16 come into elastic contact with the tester 50 via the plate spring members 12B, 14B and 16B, respectively. Accordingly, it is possible to achieve sufficient electrical conductivity between the probe card 10 and the tester 50. Further, since each of the plate spring members 12B, 14B and 16B is divided into the multiple stripe-shaped portions, it is possible to set a required current value by adjusting the number of the stripe-shaped portions. In addition, since the first, second and third connecting terminals 12, 14 and 16 have the connectors 12A, 14A and 16A, respectively, it is possible to flow the large current more securely through the connectors 12A, 14A and 16A.

Now, a second example embodiment will be discussed.

Figure 6A:
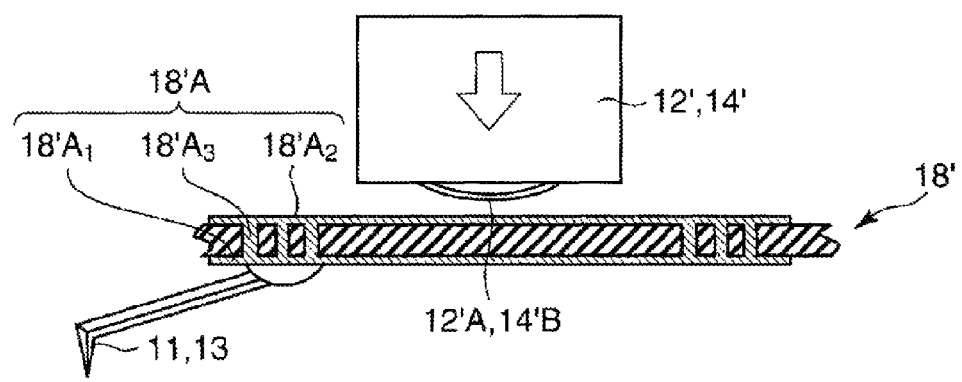
FIG. 6A is a cross sectional view illustrating major parts of a probe card in accordance with a second example embodiment.
Figure 6B:
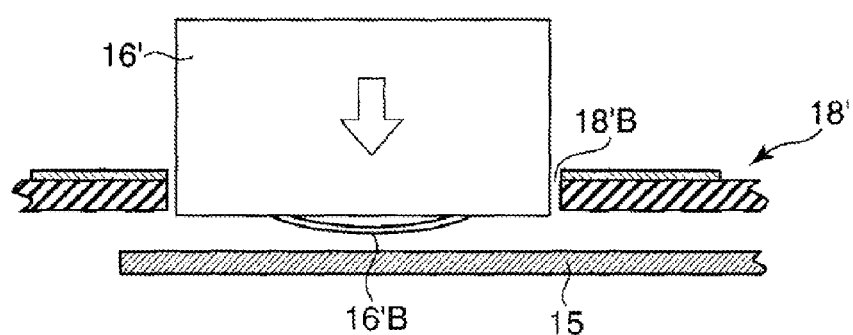
FIG. 6B is a cross sectional view illustrating major parts of the probe card in accordance with the second example embodiment.
Figure 7A:
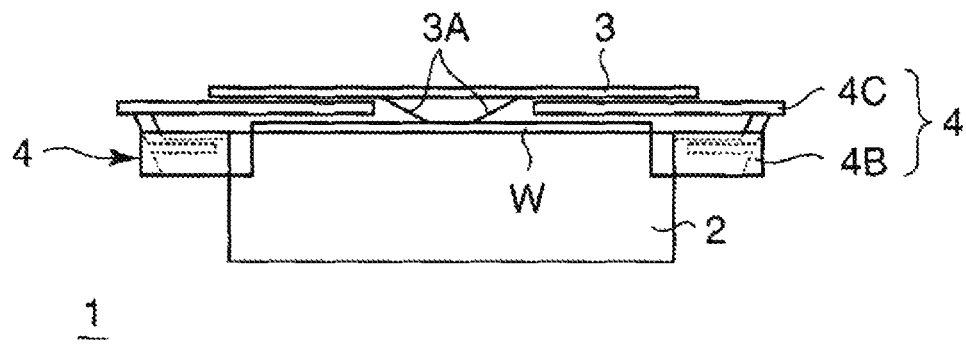
FIG. 7A is a side view illustrating major parts of a conventional probe apparatus previously proposed by the present applicant.
Figure 7B:
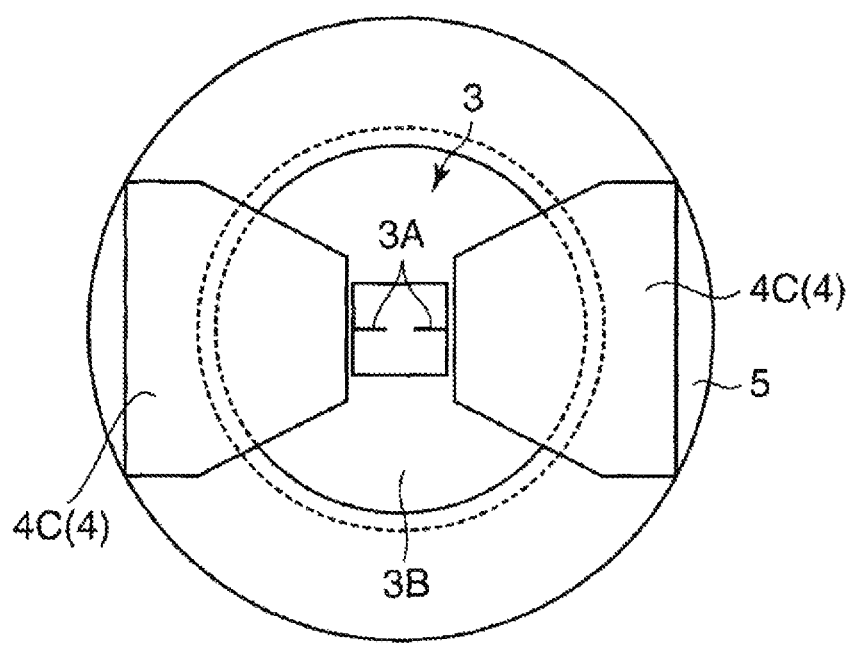
FIG. 7B is a plane view illustrating a bottom surface of a probe card as a major part of the conventional probe apparatus previously proposed by the present applicant.

FIG. 6A and FIG. 6B are cross sectional views illustrating major parts of a probe card in accordance with the second example embodiment.

A probe card 10A of the second example embodiment is characterized in that a circuit board 18' is used instead of the supporting board 18 of the first example embodiment, and a block-shaped first connecting terminal 12, a block-shaped second connecting terminal 14 and a block-shaped third connecting terminal 16 are provided at a tester (not shown). The other configurations are the same as those of the first example embodiment. Below, only distinctive parts of the second example embodiment will be elaborated.

As shown in FIG. 6A, formed on the circuit board 18' of the probe card 10A is a wiring pattern 18'A to which a first probe 11 and a second probe 13 are connected. The wiring pattern 18'A includes a first wiring conductor 18'A$_1$, a second wiring conductor 18'A$_2$ and a via conductor 18'A$_3$. The first wiring conductor 18'A$_1$ and the second wiring conductor 18'A$_2$ are formed on a rear surface and a front surface of the circuit board 18' in certain patterns, respectively. The via conductor 18'A$_3$ connects the first wiring conductor 18'A$_1$ and the second wiring conductors 18'A$_2$. The first and second probes 11 and 13 are connected to the first wiring conductor 18'A$_1$ on the rear surface of the circuit board 18' by, e.g., solder.

Further, as illustrated in FIG. 6B, formed in the circuit board 18' is a hole 18'B through which a third connecting terminal 16' corresponding to a collector terminal of the tester is inserted. When bringing the tester into contact with the probe card 10A, the third connecting terminal 16' comes into elastic contact with, through the hole 18'B of the circuit board 18', a contact plate 15 fixed to the circuit board 18'B via a plate spring member 16'B.

In the second example embodiment, when connecting the tester and the probe card 10A mounted in the probe apparatus, if the tester is moved toward the probe card 10A, the first connecting terminal 12' and the second connecting terminal 14' provided at the tester come into elastic contact with the second wiring conductor 18'A$_2$ of the wiring pattern corresponding to the first and second probes 11 and 13 of the circuit board 18'. The third connecting terminal 16' comes into elastic contact with the contact plate 15 through the hole 18'B of the circuit board 18'. In this state, multiple power devices D formed on the semiconductor wafer W is inspected. In this second example embodiment, the same effects as obtained in the first example embodiment can also be achieved.

The present disclosure is not limited to the above-described example embodiments, and various modifications can be made, as required.

EXPLANATION OF CODES 10, 10A: Probe card
11: First probe
12, 12': First connecting terminal
12A: Connector (terminal block)
12'A: Plate spring member
13: Second probe
14, 14': Second connecting terminal
14A: Connector (terminal block)
14'B: Plate spring member
15: Contact plate
16, 16': Third connecting terminal
16A: Connector (terminal block)
16'B: Plate spring member
18: Supporting board
18': Circuit board
18'B: Hole
W: Semiconductor wafer
D: Power device

We claim:

1. A probe card that inspects a dynamic characteristic of a plurality of power devices formed on a semiconductor wafer, the probe card comprising:
a first probe configured to come into electric contact with an emitter electrode of the power device;
a block-shaped first connecting terminal to which the first probe is connected;
a second probe configured to come into electric contact with a gate electrode of the power device;
a block-shaped second connecting terminal to which the second probe is connected;
a contact plate configured to come into electric contact with a collector electrode of the power device;
a supporting board to which the first connecting terminal and the second connecting terminal are fixed; and
a block-shaped third connecting terminal fixed to the contact plate,
wherein the first connecting terminal and the second connecting terminal are inserted through the supporting board and exposed from two opposite surfaces of the supporting board,
and
the third connecting terminal is inserted through a hole formed in the supporting board.

2. The probe card of claim 1,
wherein a plate spring member whose central portion is protruded is provided on a surface of each of the first connecting terminal, the second connecting terminal and third connecting terminal.

3. The probe card of claim 2,
wherein the plate spring member includes a plurality of stripe-shaped portions.

4. The probe card of claim 1,
wherein each of the first connecting terminal, the second connecting terminal and the third connecting terminal has a connector.

5. An inspection device comprising a probe card, a mounting table and a tester that inspects a dynamic characteristic of a plurality of power devices formed on a semiconductor wafer, the probe card comprising:
a first probe configured to come into electric contact with an emitter electrode of the power device;
a block-shaped first connecting terminal to which the first probe is connected;
a second probe configured to come into electric contact with an gate electrode of the power device;
a block-shaped second connecting terminal to which the second probe is connected;
a contact plate configured to come into electric contact with a collector electrode of the power device;
a supporting board to which the first connecting terminal and the second connecting terminal are fixed;
and
a block-shaped third connecting terminal fixed to the contact plate,
wherein the first connecting terminal, the second connecting terminal and the third connecting terminal are configured to electrically come into direct contact with corresponding connection terminals of the tester, respectively,
the first connecting terminal and the second connecting terminal are inserted through the supporting board and exposed from two opposite surfaces of the supporting board,
the contact plate is connected to a contact block provided at a side surface of the mounting table, and
the third connecting terminal is inserted through a hole formed in the supporting board.

6. The inspection device of claim 5,
wherein a leading end portion of the contact block is elastically moved in a vertical direction.

7. The inspection device of claim 5,
wherein the contact plate is connected to a conductive film electrode formed on a surface of the mounting table via the contact block.
8. The probe card of claim 1,
wherein the contact plate is fixed to a card holder, and a spacer is provided at a fixed position between the contact plate and the card holder.
9. The inspection device of claim 5,
wherein the contact plate is fixed to a card holder, and a spacer is provided at a fixed position between the contact plate and the card holder.

* * * * *